United States Patent [19]

Sakai et al.

[11] Patent Number: 4,883,424
[45] Date of Patent: Nov. 28, 1989

[54] APPARATUS FOR HEAT TREATING SUBSTRATES

[75] Inventors: Takamasa Sakai; Yuusuke Muraoka, both of Kyoto, Japan

[73] Assignee: Dainippon Screen Mfg. Co., Ltd., Japan

[21] Appl. No.: 233,236

[22] Filed: Aug. 17, 1988

[30] Foreign Application Priority Data

Aug. 21, 1987 [JP] Japan .................. 62-208943

[51] Int. Cl.⁴ .......................... F27D 15/02
[52] U.S. Cl. ...................... 432/77; 432/121
[58] Field of Search ............ 432/77, 81, 83, 5, 6, 432/11, 258, 253, 121

[56] References Cited

U.S. PATENT DOCUMENTS

| | | | |
|---|---|---|---|
| 4,050,881 | 9/1977 | Watson, Jr. | 432/5 |
| 4,560,348 | 12/1985 | Moller et al. | 432/77 |
| 4,584,180 | 4/1986 | Ostrov | 432/77 |

OTHER PUBLICATIONS

"Semiconductor World 1985 12", pp. 64–71.

Primary Examiner—Henry C. Yuen
Attorney, Agent, or Firm—Ostrolenk, Faber, Gerb & Soffen

[57] ABSTRACT

An apparatus for heat treating substrates. The apparatus comprises a furnace core tube for containing the substrates, a heater provided for enclosing the furnace core tube, an inner cylinder provided for enclosing the heater, and an outer cylinder with a path for cooling water provided therein. The apparatus further comprises a heat reflecting mirror formed on an inner surface of the outer cylinder and a blower for ventilating the space between the furnace core tube and the inner cylinder. After heat treatment of the substrates is carried out, the blower is activated and the cooling water is circulated in the outer cylinder. Therefore, an undesirable rise in the temperature of the mirror can be prevented.

8 Claims, 2 Drawing Sheets

APPARATUS FOR HEAT TREATING SUBSTRATES

BACKGROUND OF THE INVENTION

1. Field of the Invention

The present invention relates to an apparatus for heating semiconductor substrates contained in a furnace core tube to perform desired processing on the substrates. The apparatus may be an oxidation furnace, a diffusion furnace, a reaction furnace in a CVD (chemical vapor deposition) apparatus and the like. More specifically, the present invention relates to an apparatus capable of quick heating-quick cooling.

2. Description of the Prior Art

A heat treating apparatus of particular interest to the present invention is disclosed in, for example, Semiconductor World 1985, 12, p 65. FIG. 1 illustrates the apparatus disclosed therein. A furnace having small heat capacity is employed as an apparatus for heat treating the substrate. The reason for this is that the smaller the heat capacity, the shorter the time required for heating and cooling. Therefore, reducing heat capacity improves process efficiency.

FIG. 1 illustrates a known apparatus for heat treating substrates. The apparatus comprises a furnace core tube 102 which is formed of quartz. Substrates 101 are contained within the tube 102. The apparatus further comprises a nichrome wire heater 103 provided around an outer circumference of the furnace core tube 102; an outer cylindrical furnace 105 (formed of a material with small heat capacity and a blower 113 for forcing cooling air to the space between the furnace core tube 102 and the outer cylindrical furnace 105. The furnace core tube 102 and the heater 103 are contained within the furnace 105. The apparatus is structured such that the inside of the furnace can be quickly heated or cooled.

The outer cylindrical furnace 105 is formed of a material having small heat capacity. Therefore, the ability of the apparatus to accumulate heat is small. Thus, the inside of the furnace can be quickly cooled. However, the apparatus shown in FIG. 1 has a disadvantage in that when a high temperature is maintained within the furnace the loss of heat is large since the apparatus has little heat insulation. Therefore, the above described apparatus is not preferred for high temperature heat treatment. By "high temperature heat treatment" is meant treatment performed at a temperature higher than, for example, 400° C.

FIG. 2 illustrate an improvement of the apparatus shown in FIG. 1. The apparatus of FIG. 2 is used for heat treatment at temperatures of about 800° C. to 1000° C., for example. The apparatus shown in FIG. 2 comprises a mirror 108 for reflecting heat rays. The mirror 108 is formed on an internal circumferential surface of the outer cylindrical furnace 105 and is designed to reflect radiation heat.

In the furnace shown in FIG. 2, the mirror 108 becomes hot due to heat conduction through a gas existing between the heater 103 and the mirror 108. Therefore, the mirror 108 is formed of gold (Au) to prevent degradation of the mirror's ability to reflect heat and to prevent damage caused by heat. However, gold does not have a very high reflectance in the same wavelength range whereat the semiconductor substrate readily absorbs heat. Therefore, heat is inefficiently used in the prior art apparatuses.

SUMMARY OF THE INVENTION

Therefore, one object of the present invention is to provide an apparatus for heat treating substrates which is capable of effectively utilizing heat rays.

Another object of the present invention is to provide an apparatus which has a heat reflecting mirror with a high reflectance in the wavelength range wherein the heat absorbing ratio of the semiconductor substrate is high.

A further object of the present invention is to provide such an apparatus in which a mirror is not heated.

A still further object of the present invention is to provide a treating apparatus in which the mirror has a long life.

The above-described objects of the present invention can be attained by an apparatus for heat treating a substrate, said apparatus comprising: a container for housing a substrate to be heated; heating means for enclosing said container and for heating said substrate; heat intercepting means for intercepting heat generated by said heating means, said heat intercepting means enclosing said heating means; an outer furnace enclosing said heat intercepting means, said outer furnace having an inner surface; a reflector formed on said inner surface of said outer furnace for reflecting heat generated by said heating means; and a sealed layer of heat insulating gas located between said heat intercepting means and said outer furnace; and wherein said outer furnace has cooling means associated therewith for cooling the reflector.

Since the apparatus comprises the above described components, a heat insulating layer of gas is formed between the heat intercepting member and the enclosure. The gas layer prevents conduction of heat so that the member is not unduly heated heated. In addition, a heat exchanging type cooling member is provided on the enclosure to positively prevent the reflecting member from being undesirably heated. Therefore, the reflecting member can be made of materials other than gold. In particular, materials which have a higher reflectance than gold can be used. Consequently, the apparatus effectively utilizes heat.

According to a preferred embodiment of the present invention, the heat insulating layer of gas has a prescribed space defined by the heat intercepting member and the enclosure. The prescribed space has a dimension such that convection is prevented. The gas of the heat insulating layer comprises an inactive gas having low heat conductivity.

Since the apparatus comprises the above described components, the heat insulating effect is improved, and the oxidation of the reflecting member can be prevented. The reflecting member is not unduly heated. Thus, the reflecting member can have a long life.

According to a more preferred embodiment of the present invention, the member for reflecting heat is formed of aluminum. The heat reflected by aluminum is easily absorbed by the substrate (e.g., a silicon wafer for which absorption is about 98%). Consequently, an apparatus can be provided which comprises a heat reflecting member having high reflectance in that range of wavelengths where the heat absorbing ratio of the semiconductor substrate is high.

These objects and other objects, features, aspects and advantages of the present invention will become more apparent from the following detailed description of the

DESCRIPTION OF THE PREFERRED EMBODIMENTS

Figure 1:
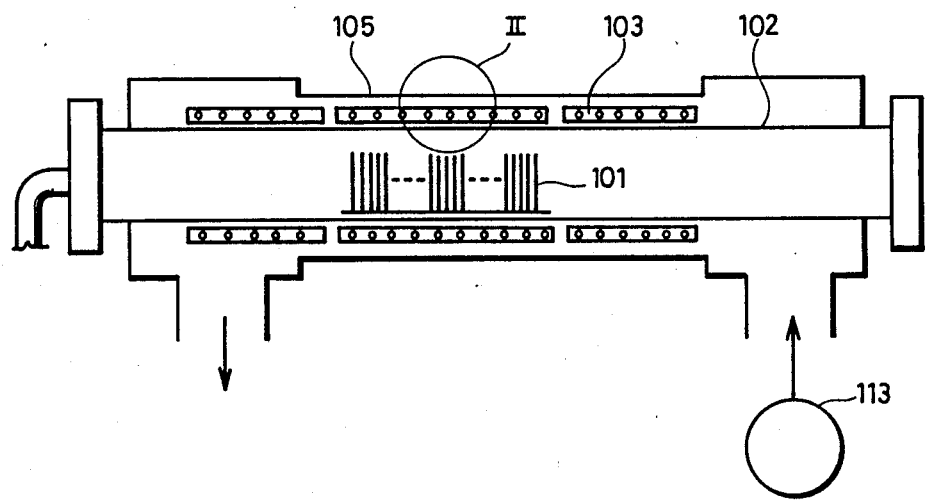
FIG. 1 is a schematic diagram showing a conventional apparatus for heat treating substrates.
Figure 2:
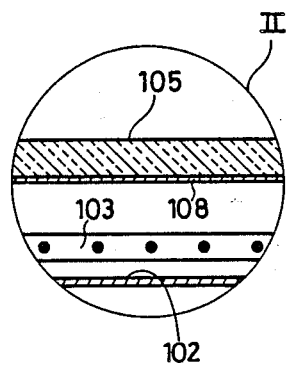
FIG. 2 is a cross-sectional view of a portion shown by II in FIG. 1.
Figure 3:
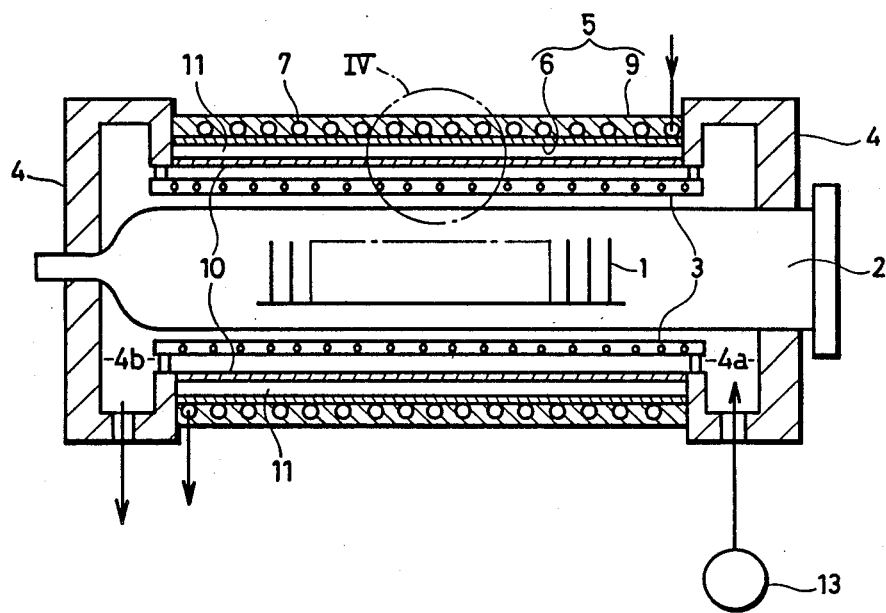
FIG. 3 is a cross-sectional view of an apparatus for heat treating substrates in accordance with the present invention.
Figure 4:
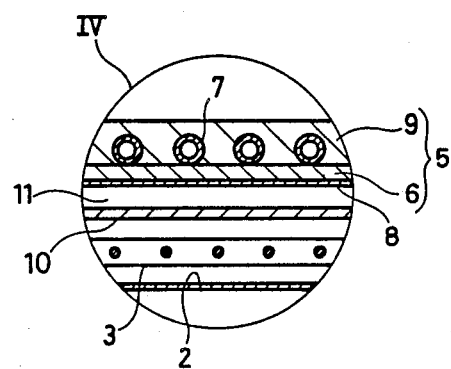
FIG. 4 is a cross-sectional view of the portion shown by IV in FIG. 3.

The preferred heat treating apparatus comprises a furnace core tube 2. The tube 2 is formed of quartz. A plurality of substrates are contained within the tube 2. The apparatus further comprises a heater arranged to enclose the tube 2 and an outer cylindrical furnace 5. An inner circumferential surface of the furnace is mirror finished. The furnace core tube 2 and the heater are contained within the furnace 5. The apparatus further comprises a heat insulating cylinder 10 to form a gas heat insulating layer in the outer cylindrical furnace 5, and a blower 13 for forcing ventilating cooling air to the space between the heat insulating cylinder 10 and the furnace core tube 2.

The quartz furnace core tube 2 and the heater 3 have their end portions supported by a pair of flanges 4.

The outer cylindrical furnace 5 and the heat insulating cylinder 10 have their ends supported and sealed by the flanges 4 to seal the gas insulating layer 11.

The outer cylindrical furnace 5 comprises an inner cylindrical member 6 and an outer cylindrical member 9.

The inner member 6 and the outer member 9 are both formed of aluminum. A refrigerant circulating tube 7 for cooling the furnace 5 is spirally wound around the outer circumference of the inner cylindrical member 6. an outer cylindrical member 9 is molded outside the tube. A mirror finish 8 is formed on an inner circumferential surface of the inner cylindrical member 6 so as to reflect heat.

The cylinder 10 is formed of a material which transmits heat but which is heat-resistant (such as quartz, alumina, silicon carbide, and the like). The thickness of the layer 11 is less than 20 mm to suppress convection of the gas in the heat insulating layer 11. Preferably, an inactive gas with a low heat conductivity is sealed in the layer 11 to prevent oxidation of the mirror 8 and to improve the heat insulating capability of the layer 11. The heat insulating cylinder 10 may have a repeated structure with a number of gas heat insulating layers, if necessary.

The thickness of the insulating layer 11 need not be limited to 20 mm if there is no convection of sealed gas in the layer 11.

Convection of gas is suppressed in the preferred gas heat insulating layer 11. Consequently, heat loss due to heat conduction to the outer cylindrical furnace 5 can be prevented and, at the same time, high temperatures in the heat ray reflecting mirror can be prevented. The layer 11 transmits radiation heat which is reflected by the mirror 8 so that the efficiency with which the temperature in the furnace can be raised and kept at a high temperature is increased.

No material has a heat ray absorbing ratio equal to zero. Though little, the small amount of heat which is inevitably absorbed by the mirror 8 raises the temperature of the mirror. In order to prevent the heat ray reflecting mirror 8 from getting hot, a refrigerant circulating tube 7 is provided on the outer cylindrical furnace 5. Cooling water, refrigerant gas and the like is circulated through the tube 7 which cools the mirror 8. Thus, not only a heat insulating layer 11 of gas but also a heat exchanging type cooling means is provided on the outer cylindrical furnace 5. Consequently, the reflecting mirror 8 cannot be undesirably heated. With the preferred apparatus, there is no need to consider heat resistance when selecting the material of the mirror 8. The material can be selected from a wide range of materials. Aluminum is selected in the preferred embodiment. Aluminum is chosen because the reflectance of aluminum is about 98% against the near infrared and shorter wavelength rays which are highly absorbed by the silicon wafer substrate. Therefore, heat can be more effectively utilized. The 98% reflectance of aluminum compares favorably to the reflectance of gold which is about 50%.

The flanges 4 have an inlet port and an outlet port coupled to the blower 13. When temperature in the furnace should be lowered to the ambient temperature, the cooling air is drafted into the furnace by the blower 13. By ventilating the air in the space between the heat insulating cylinder 10 and the furnace core tube 2, the heated gas in that space is quickly discharged and the heater 3 and the furnace core tube 2 are directly cooled. Although the outer cylindrical furnace 5 comprises two layers (the inner cylindrical member 6 and the outer cylindrical member 9) in the above described embodiment, the outer cylindrical furnace 5 may have a unitary structure. The outer cylindrical furnace 5 is formed of aluminum with the inner circumferential surface thereof mirrored to provide the heat reflecting mirror 8. The outer cylindrical furnace 5 can be formed of a material other than aluminum. The furnace 5 may have an aluminum deposited film formed on the inner circumferential surface thereof and a protective film formed of aluminum oxide may be formed thereon. The mirror 8 may be formed of deposited film of a material other than aluminum.

Although a horizontal-type heat treatment furnace in which the axis of the furnace core tube is arranged horizontally has been described herein the present invention may be applied to a vertical-type heat treatment furnace.

In the present invention, a layer of heat insulating gas is formed inside the outer cylindrical furnace. The gas transmits heat rays therethrough. Therefore, a heat exchange-type cooling means is provided on the outer cylindrical furnace so that the heat ray reflecting mirror can be positively prevented from being undesirably heated. Therefore, the mirror need not be formed of gold.

In the present invention, heat resistance is not as great a consideration as in the prior art. The mirror can be formed of a wide variety of materials. A material having higher reflectance than gold can be employed. Therefore, efficiency is improved and can be more effectively utilized. Therefore, the present invention enables both quicker heating and during periods of maintained high temperature, smaller heat loss.

The portion of the apparatus to be heated is limited to the portion surrounded by the heat insulating layer of gas. Therefore, the heat capacity of the apparatus is small. This also shortens the time required for heating. When the means for cooling the furnace core tube and heater is provided, cooling speed can be increased as heat capacity becomes small.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. An apparatus for heat treating a substrate, said apparatus comprising:
   a container for housing a substrate to be heated;
   heating means for enclosing said container and for heating said substrate;
   heat intercepting means for intercepting heat generated by said heating means, said heat intercepting means enclosing said heating means;
   an outer furnace enclosing said heat intercepting means, said outer furnace having an inner surface;
   a reflector formed on said inner surface of said outer furnace for reflecting heat generated by said heating means; and
   a sealed layer of heat insulating gas located between said heat intercepting means and said outer furnace; and
   wherein said outer furnace has cooling means associated therewith for cooling said reflector.

2. An apparatus according to claim 1, further comprising:
   a space formed between said heat intercepting means and said container; and
   a ventilator for ventilating said space.

3. An apparatus according to claim 2, wherein: said heat intercepting means is formed of a material which transmits heat rays but which is heat-resistant.

4. An apparatus according to claim 3, wherein:
   said gas layer is defined by said heat intercepting means and said outer furnace; and
   said gas layer has a dimension selected to suppress convection of said gas.

5. An apparatus according to claim 4, wherein said gas comprises an inactive gas having low heat conductivity.

6. An apparatus according to claim 3, wherein:
   said heating means is adapted to irradiate heat rays of various wavelengths; and
   said reflector is formed of a material which reflects heat rays of wavelengths which are easily absorbed by said substrate.

7. An apparatus according to claim 6, wherein said material of said reflector comprises aluminum.

8. An apparatus according to claim 1, wherein said container is a furnace core tube.

* * * * *